United States Patent
Zunft

(10) Patent No.: US 10,877,064 B2
(45) Date of Patent: Dec. 29, 2020

(54) EVALUATION CIRCUIT FOR A CAPACITIVE ACCELERATION SENSOR AND DEVICE FOR DETECTING AN ACCELERATION

(71) Applicant: Robert Bosch GmbH, Stuttgart (DE)

(72) Inventor: Steffen Zunft, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 262 days.

(21) Appl. No.: 15/992,650

(22) Filed: May 30, 2018

(65) Prior Publication Data

US 2018/0348253 A1 Dec. 6, 2018

(30) Foreign Application Priority Data

May 31, 2017 (DE) .......... 10 2017 209 096

(51) Int. Cl.
 *G01P 21/00* (2006.01)
 *G01P 15/125* (2006.01)
 *G01R 31/00* (2006.01)

(52) U.S. Cl.
 CPC ............ *G01P 21/00* (2013.01); *G01P 15/125* (2013.01); *G01R 31/00* (2013.01)

(58) Field of Classification Search
 CPC ........ G01P 15/125; G01P 21/00; G01R 31/00
 See application file for complete search history.

(56) References Cited

U.S. PATENT DOCUMENTS

| | | | |
|---|---|---|---|
| 5,351,519 A * | 10/1994 | Kress | |
| 2005/0218911 A1* | 10/2005 | Denison | |
| 2013/0063165 A1* | 3/2013 | Balachandran et al. | |
| 2013/0265070 A1 | 10/2013 | Kleks et al. | |
| 2014/0251012 A1 | 9/2014 | Balachandran et al. | |

FOREIGN PATENT DOCUMENTS

| | | |
|---|---|---|
| EP | 0741299 A2 | 11/1996 |
| EP | 2751580 A1 | 7/2014 |

OTHER PUBLICATIONS

Petkov, Vladimir et al. "A Fully Differential Charge-Balanced Accelerometer for Electronic Stability Control" IEEE Journal of Solid-State Circuits, Jan. 2014, vol. 49, Issue 1, pp. 262-270.

* cited by examiner

*Primary Examiner* — Randy W Gibson
*Assistant Examiner* — John M Royston
(74) *Attorney, Agent, or Firm* — Norton Rose Fulbright US LLP; Gerard Messina

(57) ABSTRACT

An additional test operating mode for an acceleration detector including two acceleration sensors in a differentiated operating mode. For this purpose, an additional test operating mode is provided, in which the reference voltage for one acceleration sensor is inverted. By comparing the output signals of the acceleration sensors and during the test operating mode, an interference, in particular a contamination of the sensors or influences by parasitic capacitances in the sensor system may be detected.

8 Claims, 1 Drawing Sheet

EVALUATION CIRCUIT FOR A CAPACITIVE ACCELERATION SENSOR AND DEVICE FOR DETECTING AN ACCELERATION

FIELD OF THE INVENTION

The present invention relates to an evaluation circuit for a capacitive acceleration sensor and to a device for detecting an acceleration.

BACKGROUND INFORMATION

Modern motor vehicles have a plurality of sensors. These sensors are used, among other things, to detect parameters, based on which numerous functions of the vehicle are controlled. Among other things, it is also possible to control safety-relevant functions, such as an electronic stability control system or the triggering of an airbag based on such sensors. For this reason, high requirements are placed on the reliability of the signals of such sensors.

The publication EP 2751580 A1 discusses a read-out circuit for a capacitive transducer. A circuit system for attenuating undesirable interferences is provided. An amplifier circuit generates an amplified converter signal. This amplified converter signal is supplied to two summation elements, which link the amplified converter signal to a positive and a negative reference voltage. The sum of the amplified converter signal and the reference voltages is returned to the transducer.

SUMMARY OF THE INVENTION

The present invention describes an evaluation circuit for a capacitive acceleration sensor having the features described herein and a device for detecting an acceleration having the features described herein.

The present invention provides for the following:

An evaluation circuit for a capacitive acceleration sensor including a first output terminal, a second output terminal, and a switching element. The output terminal is configured to provide a first voltage on a first acceleration sensor. The second output terminal is configured to provide a second voltage on a second acceleration sensor. The switching element is electrically situated between the second output terminal and the second acceleration sensor. In particular, the switching element is configured to reverse the polarity of the second voltage.

Furthermore, the following is provided:

A device for detecting an acceleration, including an evaluation circuit according to the present invention for a capacitive acceleration sensor and a first and a second capacitive acceleration sensor. The first capacitive acceleration sensor is electrically coupled to the first output terminal of the evaluation circuit. The second capacitive acceleration sensor is electrically coupled to the second output terminal of the evaluation circuit.

The present invention is based on the finding that interferences may occur due to parasitic effects, such as parasitic capacitances, during the operation of a capacitive acceleration sensor. Furthermore, with such sensors, in particular with capacitive acceleration sensors, contaminants, such as particles in the sensor area, may also result in a malfunction, and thus in an erroneous sensor value.

It is therefore one idea of the present invention to take this finding into account and to provide an evaluation circuit for a capacitive acceleration sensor, which makes it possible to reliably identify interfering effects, such as parasitic capacitances or also contaminants and a malfunction of the used acceleration sensor associated therewith. By checking, according to the present invention, the functional capability of connected acceleration sensors with the aid of a suitable evaluation circuit, malfunctions and erroneous sensor values associated therewith may be reliably identified. In this way, control or regulating processes based on such sensor values may be adapted if an interference is detected. In particular, incorrect reactions of a system due to faulty sensor values may be avoided. In this way, the operational safety of the system increases.

The acceleration sensors which are detected and checked by the evaluation circuit according to the present invention may, in particular, be a pair of two identical or at least similar capacitive acceleration sensors.

According to one specific embodiment, the evaluation circuit includes a first input terminal and a second input terminal. The first input terminal is couplable to a sensor terminal of the first acceleration sensor. The second input terminal is couplable to a sensor terminal of the second acceleration sensor. In this way, the output signals of two acceleration sensors may be jointly evaluated, for example, in a differentiated operating mode. In particular, the acceleration sensors may be identical or at least similar acceleration sensors.

According to one specific embodiment, the switching element of the evaluation circuit is configured to couple a first connection element of the second output terminal to a first voltage connection of the second acceleration sensor, and to couple a second connection element of the second output terminal to a second voltage connection of the acceleration sensor, in a first switching state. Furthermore, the switching element of the evaluation circuit is configured to couple a first connection element of the second output terminal to the second voltage connection of the second acceleration sensor, and to couple the second connection element of the second output terminal to the second voltage connection of the acceleration sensor, in a second switching state. In this way, the polarity of the voltage provided by the evaluation circuit on the second acceleration sensor may be set as a function of the switching state of the switching element. In particular, the polarity of the voltage on the second acceleration sensor may be reversed by a change in the switching state of the switching element.

According to one specific embodiment, the evaluation circuit includes a measuring circuit. The measuring circuit is configured to provide an output signal corresponding to an acceleration if the switching element is in the first switching state. Furthermore, the evaluation circuit may include an analysis unit. The analysis unit is configured to detect a malfunction of the first acceleration sensor and/or of the second acceleration sensor if the switching element is in the second switching state. In this way, depending on the state of the switching element, either an output signal corresponding to the acceleration may be provided, or alternatively the functional capability of the acceleration sensor may be checked to detect possibly present parasitic effects.

According to one specific embodiment, the analysis unit is configured to detect a malfunction of the first acceleration sensor and/or of the second acceleration sensor if an output signal of the first acceleration sensor deviates from an output signal of the second acceleration sensor by more than a predetermined threshold value. In this way, a functional check of the acceleration sensors used may be carried out by simple switching in the switching element of the evaluation circuit.

According to one specific embodiment, the analysis unit is configured to carry out a check of the first acceleration sensor and the second acceleration sensor if the evaluation circuit is initialized. In this way, a check of the connected acceleration sensors may be carried out during each initialization of the evaluation circuit.

According to one specific embodiment, the analysis unit is configured to carry out a check of the first acceleration sensor and the second acceleration sensor at predetermined time intervals. In this way, a regular check of the reliability of the measuring system including the acceleration sensors may be carried out.

The above-mentioned embodiments and refinements may be arbitrarily combined with one another, if useful. Further embodiments, refinements and implementations of the present invention also include not explicitly described combinations of features of the present invention which are described at the outset or hereafter with respect to the exemplary embodiments. Those skilled in the art will in particular also add individual aspects as improvements or supplements to the particular basic form of the present invention.

The present invention is described in greater detail hereafter based on the exemplary embodiments described in the schematic figures of the drawings.

DETAILED DESCRIPTION

Figure 1:
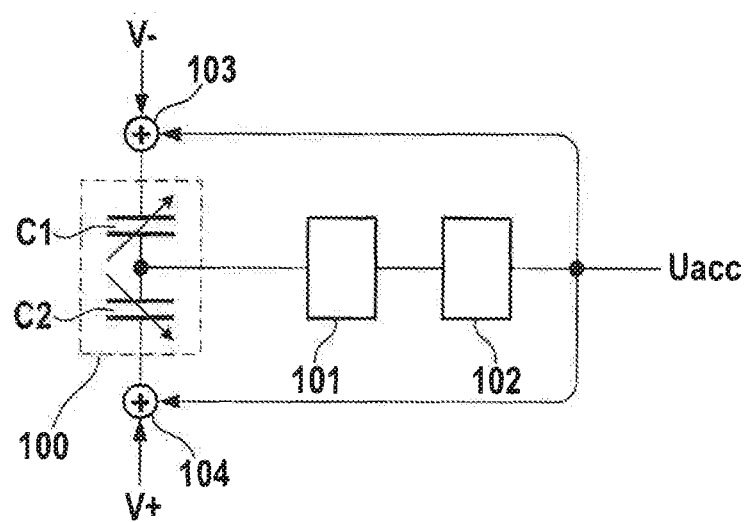
FIG. 1 shows a schematic representation of a basic circuit diagram for activating a capacitive acceleration sensor.

FIG. 1 shows a schematic representation of a basic circuit diagram for activating and evaluating a capacitive acceleration sensor 100. Such a capacitive acceleration sensor 100 may be considered as a series connection of two capacitors C1 and C2. When such an acceleration sensor 100 experiences an acceleration, capacitances C1 and C2 change, and thus also the voltage potential at the node at which the two capacitors C1 and C2 are coupled. This change in the voltage potential may be evaluated by an evaluation circuit connected at the node, represented in FIG. 1 by elements 101 and 102. For example, first element 101 may be an integrator, and second element 102 may be an amplifier circuit. Output signal Uacc supplied by such a circuit system is a voltage which corresponds to an acceleration on acceleration sensor 100.

Acceleration sensor 100 may generally be operated with an arbitrary voltage between the two outer terminals. For example, a positive reference voltage V+ and a negative reference voltage V− may be applied to the outer terminals of acceleration sensor 100. Moreover, output voltage Uacc may also be linked to reference voltages V+ and V− via summation elements 103 and 104. In this way, it is possible to suppress, or at least minimize, occurring interferences.

For a further enhancement of the accuracy and/or the reliability, it is also possible, for example, to combine two acceleration sensors with one another. A corresponding circuit system, on which the following exemplary embodiment is also based, is described, for example, in the publication "A Fully Differential Charge-Balanced Accelerometer for Electronic Stability Control: (Petkov, Vladimir P.; Balachandran, Ganesh K.; Beintner, Jochen. IEEE Journal of Solid-State Circuits, January 2014, Vol. 49, Issue 1, pages 262-270).

Figure 2:
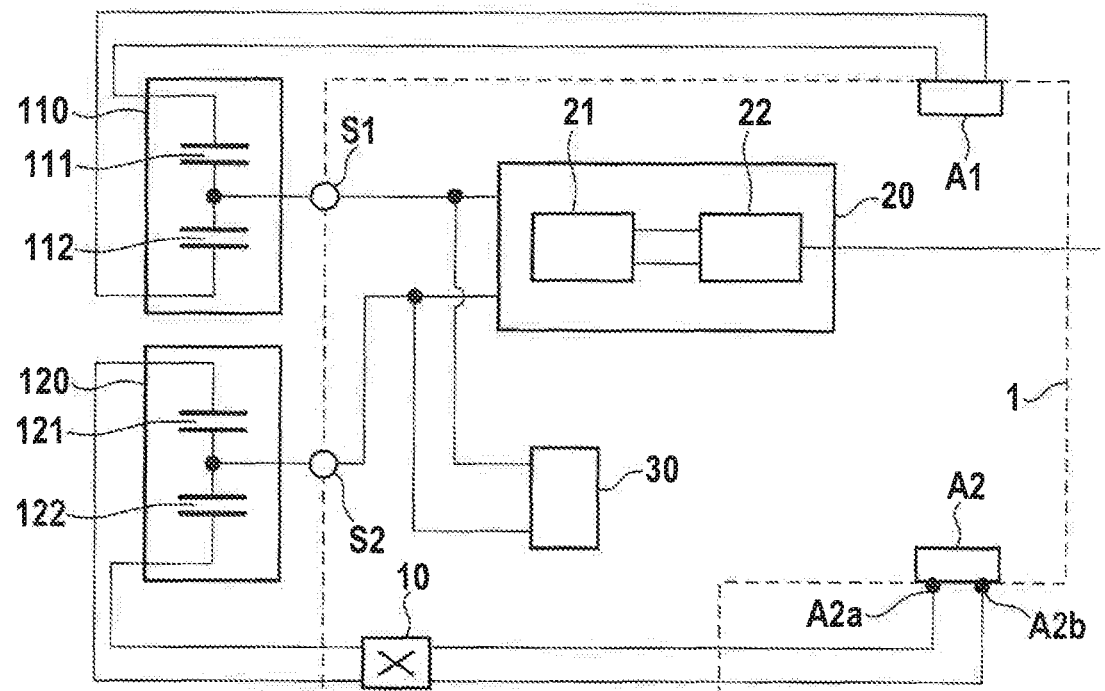
FIG. 2 shows a schematic representation of a device for detecting an acceleration including an evaluation circuit according to one specific embodiment.

As is shown in FIG. 2, the acceleration detector includes two acceleration sensors 110 and 120. Both acceleration sensors 110 and 120 are capacitive acceleration sensors. First acceleration sensor 110 forms a series connection of two capacitors 111 and 112, the node on which two capacitors 111 and 112 are connected to one another serving as the output for the sensor signal. A supply voltage is applied between the two other terminals of capacitors 111 and 112. This supply voltage is provided by first output terminal A1 of evaluation circuit 1. Analogously, second acceleration sensor 120 includes two capacitors 121 and 122. Here as well, the sensor signal is provided at the node which connects two capacitors 121 and 122 to one another. At the two other terminals of capacitors 121 and 122, a supply voltage is provided which is provided by second output terminal A2 of evaluation circuit 1.

The first sensor signal of first acceleration sensor 110 is provided on a first input terminal S1 of evaluation circuit 1. The second sensor signal of second acceleration sensor 120 is provided on a second input terminal S2 of evaluation circuit 1. Evaluation circuit 1 includes a measuring circuit 20, which evaluates the two sensor signals of acceleration sensors 110 and 120 and, using the sensor signals, provides an output signal which corresponds to an acceleration on acceleration sensors 110 and 120. For example, analogously to the circuit from FIG. 1, measuring circuit 20 may include an integrator 21 and an amplifier 22. Moreover, further circuit systems for evaluating the sensor signals of acceleration sensors 110 and 120 are possible.

In a normal operating mode, the reference voltages for acceleration sensors 110 and 120 are provided in the same manner by output terminals A1 and A2 of evaluation circuit 1. Moreover, in a further test operating mode, the polarity of the reference voltages for one of the two acceleration sensors 110 or 120 may be reversed. In the specific embodiment shown here, the polarity of the reference voltages for second acceleration sensor 120 may be reversed by switching element 10, for example. Generally, however, the present invention may also be implemented in the same manner by reversing the polarity of the reference voltage for first acceleration sensor 110.

In a normal operating mode, the two acceleration sensors 110 and 120 are operated in a differentiated operating mode by the application of corresponding reference voltages. As a result of the evaluation of the difference in the sensor voltages, an output signal corresponding to the acceleration may be generated. If switching element 10 reverses the polarity of the reference voltage for one of the two acceleration sensors 110 or 120, the two sensor signals of acceleration sensors 110 and 120 supply approximately identical output signals in the case of error-free, identical acceleration sensors.

By comparing the two sensor signals of acceleration sensors 110 and 120 in such a test operating mode, in which the reference voltage of an acceleration sensor 110 or 120 was reversed by switching element 10, the configuration and functional capability of the acceleration sensor may be checked. If the polarity of the reference voltage for one of the two acceleration sensors 110 or 120 is reversed, for example by switching element 10, an analysis unit 30 may thereupon compare the two sensor signals of acceleration sensors 110 and 120 to one another. If the two sensor signals of acceleration sensors 110 and 120 are identical or deviate from one another at least by no more than a predefined threshold value, this may be considered to be an indication of an error-free configuration. If, in contrast, analysis unit 30 establishes that, in the test operating mode, the two sensor signals deviate from one another by more than a predefined threshold value, this is an indication of an interference. For example, the circuit system may be affected due to parasitic capacitances, so that a precise, error-free evaluation of the acceleration is no longer possible. Furthermore, it is also possible that, for example, one of the two acceleration sensors 110 or 120 is affected by contaminants, for example particles in the interior of acceleration sensors 110, 120. In this case as well, if different impairments are present in the two acceleration sensors 110 and 120, the two sensor signals deviate from one another during the test operating mode.

If analysis unit 30 establishes during the operating mode that the sensor signals of the two acceleration sensors 110 and 120 deviate from one another, a signal for an interference may be output thereupon. In this case, the output acceleration signal may be classified as unreliable. In this way, if necessary, corresponding control or regulating processes may be adapted or, if necessary, even suspended during the further processing of the acceleration signal. In particular in the case of safety-relevant processes, it is possible to switch into an alternative control process upon detection of an interference in the acceleration sensors 110 or 120, in which the provided acceleration signal is not included.

The check of acceleration sensors 110 and 120 by the above-described test operating mode may be carried out, for example, during the initialization of the acceleration detector. In addition or as an alternative, the check of acceleration sensors 110 and 120 may also be carried out during operation at predefined points in time. For example, the check may be repeated regularly within predefined time intervals to be able to ensure the reliability of the acceleration signals even during an extended operation.

In summary, the present invention relates to an additional test operating mode for an acceleration detector including two acceleration sensors in a differentiated operating mode. For this purpose, an additional test operating mode is provided, in which the reference voltage for one acceleration sensor is inverted. By comparing the output signals of the acceleration sensors and during the test operating mode, an interference, in particular a contamination of the sensors or influences by parasitic capacitances in the sensor system may be detected.

What is claimed is:

1. An evaluation circuit for a capacitive acceleration sensor system, comprising:
   a first output terminal to provide a first voltage on a first acceleration sensor;
   a second output terminal to provide a second voltage on a second acceleration sensor; and
   a switching element, which is electrically situated between the second output terminal and the second acceleration sensor, and which is configured to reverse the polarity of the second voltage,
   wherein the switching element is configured to couple a first connection element of the second output terminal to a first voltage connection of the second acceleration sensor, and to couple a second connection element of the second output terminal to a second voltage connection of the sensor acceleration sensor in a first switching state.

2. The evaluation circuit of claim 1, wherein the evaluation circuit includes a first input terminal, which is couplable to a sensor terminal of the first acceleration sensor, and the evaluation circuit includes a second input terminal, which is couplable to a sensor terminal of the second acceleration sensor.

3. An evaluation circuit for a capacitive acceleration sensor system, comprising:
   a first output terminal to provide a first voltage on a first acceleration sensor;
   a second output terminal to provide a second voltage on a second acceleration sensor; and
   a switching element, which is electrically situated between the second output terminal and the second acceleration sensor, and which is configured to reverse the polarity of the second voltage,
   wherein the switching element is configured to couple a first connection element of the second output terminal to a first voltage connection of the second acceleration sensor, and to couple a second connection element of the second output terminal to a second voltage connection of the sensor acceleration sensor in a first switching state, and to couple the first connection element of the second output terminal to the second voltage connection of the second acceleration sensor, and to couple the second connection element of the second output terminal to the first voltage connection of the second acceleration sensor in a second switching state.

4. The evaluation circuit of claim 3, wherein the evaluation circuit includes a measuring circuit, which is configured to provide an output signal corresponding to an acceleration if the switching element is in the first switching state, and wherein the evaluation circuit includes an analysis unit to detect a malfunction of the first acceleration sensor and/or of the second acceleration sensor if the switching element is in the second switching state.

5. The evaluation circuit of claim 4, wherein the analysis unit is configured to detect a malfunction of the first acceleration sensor and/or of the second acceleration sensor if an output signal of the first acceleration sensor deviates from an output signal of the second acceleration sensor by more than a predetermined threshold value.

6. The evaluation circuit of claim 4, wherein the analysis unit is configured to perform a check of the first acceleration sensor and the second acceleration sensor if the evaluation circuit is initialized.

7. The evaluation circuit of claim 4, wherein the analysis unit is configured to perform a check of the first acceleration sensor and the second acceleration sensor at predetermined time intervals.

8. A device for detecting an acceleration, comprising:
   an evaluation circuit for a capacitive acceleration sensor system, including:
      a first output terminal to provide a first voltage on a first acceleration sensor;
      a second output terminal to provide a second voltage on a second acceleration sensor; and
      a switching element, which is electrically situated between the second output terminal and the second acceleration sensor, and which is configured to reverse the polarity of the second voltage;
   a first capacitive acceleration sensor, which is electrically coupled to the first output terminal of the evaluation circuit; and
   a second capacitive acceleration sensor, which is electrically coupled to the second output terminal of the evaluation circuit,
   wherein the switching element is configured to couple a first connection element of the second output terminal to a first voltage connection of the second acceleration sensor, and to couple a second connection element of the second output terminal to a second voltage connection of the sensor acceleration sensor in a first switching state.

* * * * *